(12) United States Patent
Furukawa et al.

(10) Patent No.: US 6,396,117 B1
(45) Date of Patent: May 28, 2002

(54) SEMICONDUCTOR PHOTODETECTOR, METHOD FOR MANUFACTURING SEMICONDUCTOR PHOTODETECTOR AND PHOTODETECTOR MODULE

(75) Inventors: Ryozo Furukawa; Masanobu Kato, both of Tokyo (JP)

(73) Assignee: Oki Electric Industry Co., LTD (JP)

( * ) Notice: Subject to any disclaimer, the term of this patent is extended or adjusted under 35 U.S.C. 154(b) by 0 days.

(21) Appl. No.: 09/246,143

(22) Filed: Feb. 8, 1999

(30) Foreign Application Priority Data

Aug. 31, 1998 (JP) .......................................... 10-245116

(51) Int. Cl.$^7$ .............................................. H01L 31/00
(52) U.S. Cl. ...................... 257/440; 257/435; 257/184; 385/14; 385/131
(58) Field of Search ................................ 257/440, 184, 257/435; 385/14, 131

(56) References Cited

U.S. PATENT DOCUMENTS 4,677,289 A * 6/1987 Nazaki ........................ 257/440
5,701,374 A * 12/1997 Makiuchi .................... 385/131

OTHER PUBLICATIONS

Campbell et al, "Improved Two Wavelength . . . Photodetector" *Int. and Guided–Wave Optics Tech. Dig.* Incline Village, NV. USA Jun. 1980.*

Hikari tsushin soshi kogaku "Hakko/Juko soshi" pp. 371–372, pp. 384, Kogaku Toshokan (first edition published Feb. 15, 1984), Fifth Revised Edition published May 20, 1993.

* cited by examiner

Primary Examiner—Jerome Jackson, Jr.
(74) Attorney, Agent, or Firm—Venable; James R. Burdett

(57) ABSTRACT

Light on the longer wavelength side can be photoelectrically converted and output reliably, whilst improving the structural and operational reliability of a photodetector, by means of a simple manufacturing process and inexpensive manufacturing costs. A first light-absorbing layer, a buffer layer of a second conductivity type, a second light-absorbing layer of a second conductivity type and a window layer of a second conductivity type are laminated in this order onto the first principal surface of a substrate of a first conductivity type. The first light-absorbing layer contains a region of the first conductivity type and a region of the second conductivity type, and a diffused region of the first conductivity type having a depth extending from the upper face of the window layer to the interface between the window layer and the second light-absorbing layer is provided in a portion of the window layer. A main electrode of a first conductivity type is provided on the diffused region, whilst a main electrode of a second conductivity type is provided on the window layer in the vicinity of the diffused region. The energy gap wavelength of the second light-absorbing layer is longer than the energy gap wavelength of the first light-absorbing layer, whilst the energy gap wavelength of the first light-absorbing layer is longer than the respective energy gap wavelengths of the substrate, buffer layer and window layer.

3 Claims, 5 Drawing Sheets

PRIOR ART

SEMICONDUCTOR PHOTODETECTOR, METHOD FOR MANUFACTURING SEMICONDUCTOR PHOTODETECTOR AND PHOTODETECTOR MODULE

BACKGROUND OF THE INVENTION

1. Field of the Invention

This invention relates to a semiconductor photodetector for converting light into electricity at high speed, which is suitable for use in optical communications, and more particularly, to a semiconductor photodetector which is capable of selective photoelectric conversion of light on the longer wavelength side in two-wavelength multiplex optical communications, thereby extracting the signal on this longer wavelength side, and to a method for manufacturing same and a photodetector module containing the photodetector.

2. Description of Related Art

One example of a conventional semiconductor photodetector (hereinafter, referred to as "photodetector" or "photo detecting element") is described in the reference source (Hiker tsushin soshi kogaku, "Hakko/Juko soshi", pp. 371–372, pp. 384, Kogaku Toshokan). FIG. 6 is a general sectional view showing the composition of-the photodetector according to this source. This photodetector 100 is a planar surface-exposure-type photodetector using an InGaAs-type compound semiconductor. This photo detecting element 100 comprises an n-InP buffer layer 103, an n-InGaAs light-absorbing layer 105, an n-InP window layer 107, and an insulating film 109, laminated in this order onto an n+ InP substrate 101. A portion of the n-InP window layer 107 is constituted by a p+ diffused region 111. Furthermore, a p-side electrode 113 which is electrically connected to the p+ diffused region 111 is provided on the p+ diffused region 111, and an n-side electrode 115 is provided on the rear face of the n+-InP substrate 101. A short-wavelength shielding filter 117 formed by a dielectric film is provided on the light receiving surface of the photo detecting element 100, on top of the insulating film 109. The p-side electrode 113 is exposed outside the short-wavelength shielding filter 117 (FIG. 6).

This photodetector 100 uses the photovoltaic effect of a pn junction diode. In two-waveleilgth multiplex optical communications, it performs photoelectric conversion of light on the longer wavelength side, selectively. Light on the shorter wavelength side is shut out by being reflected at the exposed surface of the aforementioned short-wavelength shielding filter 117, so only light on the longer wavelength side reaches the light-absorbing layer 105. Therefore, in the light-absorbing layer 105, only this light on the longer wavelength side is photoelectrically converted, and hence it is possible to extract the electrical signal on the longer wavelength side alone.

Moreover, FIG. 7 is a general compositional view of a conventional semiconductor photodetector module (hereinafter, referred to as "module") provided with a short-wavelength shielding filter, and it shows a sectional view thereof. This module 200 comprises: an optical fiber 201 having a light emitting end face 201a; a ferrule 203 for supporting the optical fiber 201 in the center portion thereof; a lens 205 for focusing light emitted from the optical fiber 201; a semiconductor photodetector 207 onto which this focused light is irradiated; and a header 209 onto which the photodetector 207 is fixed. In this module 200, a short-wavelength shielding filter 211 is provided between the lens 205 and the semiconductor photodetector 207 (FIG. 7).

In this module 200, if multiplexed light comprising two light beams of different wavelengths is emitted from the optical fiber 201, then the light on the shorter wavelength side in the light focused by the lens 205 will be shut out by the short-wavelength shielding filter 211. Therefore, light on the longer wavelength side will be irradiated onto the photodetector 207. In this way, only light on the longer wavelength side is photoelectrically converted and so only the signal corresponding to this light can be extracted.

However, in a conventional photodetector as described above, a short-wavelength shielding filter made from a dielectric film is provided in order to shut out light on the shorter wavelength side from the light receiving surface of the element. The material used as the short-wavelength shielding filter for a semiconductor photodetector of this composition is a dielectric film. This dielectric film is formed from a different material to the dielectric films used in standard wafer processing, such as silicon oxide films, silicon nitride films, or the like. If a dielectric film forming a filter is provided on an underlying layer, then the difference in coefficient of expansivity between the filter and the underlying layer on which the filter is provided will be large, and therefore problems will arise in that the structural and operational reliability of the photodetector will deteriorate.

Moreover, processing problems also arise in that different etching methods are used for the filter and the other layers constituting the photodetector. Consequently, there is a possibility that the manufacturing equipment and processing involved will become more complex, thereby causing costs to rise also.

Furthermore, in a photodetector module having a structure wherein a short-wavelength shielding filter is provided between the semiconductor photodetector and the lens, increase in costs is unavoidable due to the need to provide a new, special filter in the conventional module structure.

There are also cases where light on the shorter wavelength side is reflected at the surface of the filter and is returned back to the transmitting side. This back-reflected light causes noise, and may degrade the reliability of the optical communications system.

Moreover, attenuation occurs in the light on the longer wavelength side transmitted by the filter, and therefore degradation of the signal may also occur.

SUMMARY OF THE INVENTION

This invention was devised with the foregoing in view. Therefore, it is an object of the invention to provide a semiconductor photodetector having a structure whereby light on the longer wavelength side can be photoelectrically converted and output reliably, whilst improving the reliability of the photodetector (or photo detecting element) in terms of its structure and operational performance, by means of a simple manufacturing process and inexpensive manufacturing costs.

It is a further object of this invention to provide a method for manufacturing a semiconductor photodetector (or photo detecting element) of this kind, inexpensively.

It is yet a further object of this invention to provide a photodetector (or photo detecting element) module for carrying out optical communications, whereby the reliability of an optical communications system is not degraded and no signal deterioration occurs.

According to a first aspect of the present invention, there is provided a semiconductor photodetector having the following composition. A first light-absorbing layer, a buffer layer of a second conductivity type, a second light-absorbing layer of a second conductivity type and a window layer of a second conductivity type are laminated successively onto a first principal surface of a substrate of a first conductivity type. The first light-absorbing layer comprises a region of a first conductivity type and a region of a second conductivity type provided in a laminated fashion in this order from the substrate. A diffused region of a first conductivity type having a depth extending from the upper face of the window layer to the interface between the window layer and the second light-absorbing layer is provided in a portion of the window layer. A main electrode of a first conductivity type, electrically connected to the diffused region, is provided on the diffused region; and a main electrode of a second conductivity type, electrically connected to the window region, is provided on the window region. In this semiconductor photodetector, the energy gap wavelength of the second light-absorbing layer is longer than the energy gap wavelength of the first light-absorbing layer, and the energy gap wavelength of the first light-absorbing layer is longer than the respective energy gap wavelengths of the substrate, buffer layer and window layer.

For example, multiplexed light comprising light of two different wavelengths is irradiated via the second principal surface of the substrate of this semiconductor photodetector. Here, the light on the shorter wavelength side has a shorter wavelength than the energy gap wavelength of the first light-absorbing layer and the light on the longer wavelength side has a wavelength that is longer than the energy gap wavelength of the first light-absorbing layer, but shorter than the energy gap wavelength of the second light-absorbing layer. The light having a wavelength shorter than the energy gap wavelength of the first light-absorbing layer is absorbed by the first light-absorbing layer. The light having a wavelength longer than the energy gap wavelength is transmitted. Therefore, the light on the shorter wavelength side in the incident light is absorbed by the first light-absorbing layer and the light on the longer wavelength side, which is transmitted by the first light-absorbing layer, is absorbed by the second light-absorbing layer. The light on the longer wavelength side absorbed by the second light-absorbing layer is extracted as an electrical signal from the main electrode of the first conductivity type and the main electrode of the second conductivity type, by means of photoelectric effect.

Therefore, it is possible to achieve a structure whereby light on the longer wavelength side can be photoelectrically converted and output reliably, without using a short-wavelength shielding filter composed of a dielectric film. Moreover, since the first light-absorbing layer for shutting out the light on the shorter wavelength side can be constituted by a material which does not increase the disparity in coefficient of expansion between the layers forming the photo detecting element, it is possible to increase the reliability of the photo detecting element in terms of its structure and its operating characteristics. Moreover, since no short-wavelength shielding filter is used in this photo detecting element, manufacture is simple and manufacturing costs are inexpensive.

Furthermore, carriers generated by the light on the shorter wavelength side absorbed by the first light-absorbing layer are trapped in the pn junction region formed by the region of the second conductivity type and the region of the first conductivity type. Therefore, the carriers do not travel towards the second light-absorbing layer. Consequently, it is possible to extract an electrical signal corresponding to the longer wavelength side which does not contain any electrical signal relating to the shorter wavelength side.

Preferably, the semiconductor photodetector (or photo detecting element) having the aforementioned structure, may also comprise: an auxiliary electrode of a first conductivity type provided on the second principal surface of the substrates and wiring or interconnection for providing a shorting connection between the auxiliary electrode of a first conductivity type and the main electrode of a second conductivity type.

The carriers generated by the light on the shorter wavelength side absorbed by the first light-absorbing layer are trapped in the pn junction region formed by the region of a first conductivity type and the region of a second conductivity type. The trapped carriers flow as a shorting current along the wiring or interconnection providing a shorting connection between the auxiliary electrode of a first conductivity type and the main electrode of a second conductivity type. Therefore, the carriers can be removed without accumulating in the pn junction region. Consequently, carriers originating in the light on the shorter wavelength side do not reach the vicinity of the second light-absorbing layer and the diffused region of the first conductivity type, where the light on the longer wavelength side is absorbed and converted to an electrical signal. Accordingly, it is possible to extract reliably, from the main electrode of a first conductivity type and the main electrode of a second conductivity type, a signal corresponding to the longer wavelength side only, which does not contain any signal relating to the shorter wavelength side.

According to a second aspect of this invention, there is provided a semiconductor photodetector (or photo detecting element) having the following composition. The photodetector comprises a first wave guide section and a second wave guide section provided on the first principal surface of an underlying layer, in a consecutive fashion in the direction of travel of incident light. In this photodetector, the first wave guide section is provided by laminating, at the least, a first light-absorbing layer of a first conductivity type, a first window layer of a second conductivity type and a first electrode of a second conductivity type, in this order. The second wave guide section is provided by laminating, at the least, a second light-absorbing layer of a first conductivity type, a second window layer of a second conductivity type and a second electrode of a second conductivity type, in this order. The underlying layer comprises a substrate of a first conductivity type, a buffer layer of a first conductivity type laminated onto the first principal surface of the substrate, and a third electrode of a first conductivity type provided on the second principal surface of the substrate. The energy gap wavelength of the second light-absorbing layer may be greater than the energy gap wavelength of the first light-absorbing layer, the energy gap wavelength of the first light-absorbing layer may be greater than the respective energy gap wavelengths of the substrate, buffer layer, first window layer and second window layer, and furthermore, the incident light may be entered from the end face of the first wave guide section which is opposite to the end face thereof adjacent to the second wave guide section.

By this means, if, for example, multiplexed light comprising light of two different wavelengths is used as the incident light, then the wavelength of the light on the shorter wavelength side is set such that it is shorter than the energy gap wavelength of the first light-absorbing layer, whilst the wavelength of the light on the longer wavelength side is set such that it is longer than the energy gap wavelength of the first light-absorbing layer, but shorter than the energy gap wavelength of the second light-absorbing layer.

Firstly, the incident light enters the first wave guide section, and light on the shorter wavelength side is absorbed by the first light-absorbing layer, whereas light on the longer wavelength side is transmitted. The light transmitted by the first wave guide section then enters into the second wave guide section via the end face thereof. The light on the longer wavelength side is absorbed by the second light absorbing layer. The light on the shorter wavelength side absorbed by the first light-absorbing layer can be extracted as a shorter wavelength side electrical signal by means of the first electrode of a first conductivity type in the first wave guide section and the third electrode of a second conductivity type provided on the second principal surface of the underlying layer. Furthermore, the light on the longer wavelength side absorbed by the second light-absorbing layer can be extracted as a longer wavelength side electrical signal by means of the second electrode of a first conductivity type in the second wave guide section and the third electrode. Therefore, when incident light enters the semiconductor photodetector (or photo detecting element), the respective lights can be converted photoelectrically in a selective manner, thereby enabling electrical signals to be extracted separately.

Moreover, since it is not necessary to use a filter, or the like, for shutting out light of the other wavelength in order to extract light of one wavelength in the form of an electrical signal, manufacture is simple and manufacturing costs are also inexpensive. Moreover, since each of the layers constituting the photodetector can be formed from materials which do not produce a large coefficient of expansivity with respect to mutually adjoining layers, it is possible to increase the structural and operational reliability of the photodetector.

Moreover, if, rather than two-wavelength light, multiplexed light containing more wavelengths is used as the incident light, it is possible to provide a number of wave guide sections on the first principal surface of the underlying layer corresponding to the number of wavelengths contained in the incident light. By this means, the lights contained in the incident light can each be photoelectrically converted, respectively, and extracted separately as electrical signals originating in the respective wavelengths.

According to a third aspect of this invention, a method for manufacturing the semiconductor photodetector (or photo detecting element) described above is provided. This manufacturing method comprises the steps of: successively laminating a preliminary layer for a first light-absorbing layer of a second conductivity type, a buffer layer of a second conductivity type, a second light-absorbing layer of a second conductivity type and a window layer of a second conductivity type, onto a first principal surface of a substrate of a first conductivity type; forming a diffused region having a depth extending from the upper face of the window layer to the interface between the window layer and the second light-absorbing layer by diffusing a first impurity of a first conductivity type into a portion of the window layer; and forming a main electrode of a first conductivity type on a portion of the diffused region whilst simultaneously forming a main electrode of a second conductivity type on the remaining portion of the window layer.

If this semiconductor photodetector (or photo detecting element) is used for two-wavelength multiplex optical communications, for example, then the energy gap wavelength of the preliminary layer is set such that it is shorter than the energy gap wavelength of the second light-absorbing layer. Furthermore, the energy gap wavelength of the preliminary layer is set such that it is longer than the respective energy gap wavelengths of the substrate, buffer layer and window layer.

Adjustment of the energy gap wavelengths can be achieved by altering the composition of the semiconductor materials forming the layers, for example. Moreover, the energy gap wavelength of the preliminary layer is longer than the wavelength of the light on the shorter wavelength side in the incident light, and it is shorter than the wavelength of the light on the longer wavelength side. The energy gap wavelength of the second light-absorbing layer is longer than the wavelength of the light on the longer wavelength side in the incident light. Thereby, it is possible to manufacture a photodetector (or photo detecting element) whereby, in two-wavelength multiplex optical communications, the shorter wavelength light is absorbed by the first light-absorbing layer, whilst the longer wavelength light is absorbed by the second light-absorbing layer, and an electrical signal originating in the light on the longer wavelength side only can be extracted.

According to preferred embodiments of this manufacturing method, the heating of the substrate carried out for the purpose of crystal growth of the buffer layer, second light-absorbing layer and window layer, after the preliminary layer for the first light-absorbing layer of a second conductivity type has been formed on the first principal surface of the substrate, is used to diffuse a second impurity of a first conductivity type from the substrate into the preliminary layer adjacent to the substrate, thereby forming the region of the preliminary layer adjacent to the substrate into a region of a first conductivity type. The region of the preliminary layer into which the second impurity does not diffuse forms a region of a second conductivity type. Thereby, a first light-absorbing layer comprising a region of a first conductivity type and a region of a second conductivity type is formed. Moreover, a pn junction region is formed within the first light-absorbing layer by this region of a second conductivity type and the region of a first conductivity type. The carriers generated by the light on the shorter wavelength side absorbed by the first light-absorbing layer can be trapped in this pn junction region. Therefore, it is possible to prevent carriers originating in the light on the shorter wavelength side from creating a detrimental effect on the electrical signal originating in the light on the longer wavelength side, which is ultimately to be extracted.

Moreover, according to this manufacturing method, since it is not necessary to provide a short-wavelength shielding filter composed of a material which is different to the materials constituting the photodetector, as used conventionally to shut out light on the shorter wavelength side, there is no risk of deterioration in the structural or operational reliability of the element. Furthermore, no special facilities for installing this filter are required, and hence further complication of the manufacturing process is avoided and costs relating to the manufacture of the photodetector can be reduced.

According to a fourth aspect of this invention, a semiconductor module comprising the aforementioned semiconductor photodetector (or photo detecting element) is provided. This photodetector module comprises, for example: an optical fiber; a ferrule for holding this optical fiber in the center portion thereof; a lens for focusing light emitted from an optical fiber; a semiconductor photodetector onto which the focused light is irradiated: and a header for fixing the photodetector. A semiconductor photodetector according to this invention is used as the semiconductor photodetector in this module. If this module is used as a module for two-wavelength multiplex optical communications, for example, then it is possible to extract an electrical signal originating in the light on the longer wavelength side readily, without needing to provide a short-wavelength shielding filter between the lens and the photodetector. Moreover, since it is not necessary to provide a filter, there is no risk that light reflected at the filter will return to the transmitting side as back-reflected light. Therefore, it is possible to prevent degradation of the reliability of the optical communications system. Moreover, since the light on the longer wavelength side, which is to be extracted, is not attenuated by passing through a filter, it is possible to prevent signal degradation caused by the filter.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

With reference to the drawings, embodiments of this invention will be described herein below. The drawings give only an approximate illustration of the shape, size and positional relationships of the constituent elements in order that the invention can be understood, and therefore the invention is not limited to the examples illustrated. Furthermore, in order to make the drawings easier to comprehend, in some portions of the drawings, the hatching (diagonal lines) indicating cross-sections has been omitted.

First Embodiment

Figure 1:
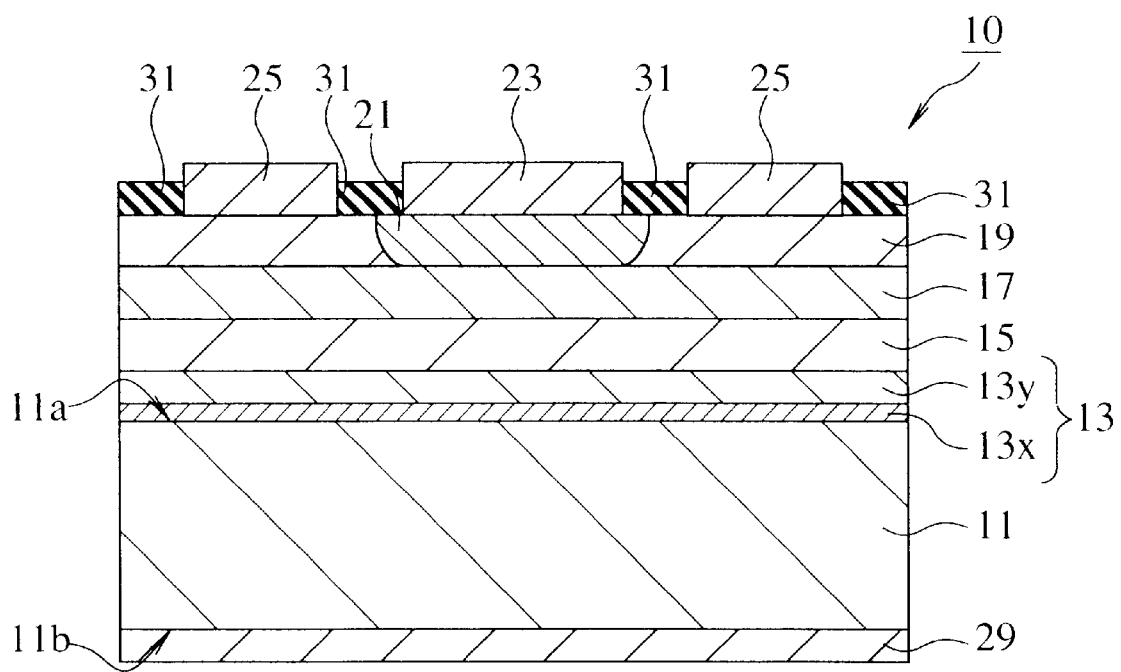
FIG. 1 is a sectional view schematically showing the general structure of a first embodiment of the semiconductor photodetector according to this invention.

As a first embodiment, a description will be now given of an example where the invention is applied to a planar-type rear face-exposure-type photodetector, with reference to FIG. 1.

FIG. 1 is a general diagram schematically showing the composition of a semiconductor photodetector according to this embodiment, and it shows a sectional view through the photodetector. This semiconductor photodetector is, for example, a compound semiconductor photodetector for the purpose of selectively extracting an electrical signal originating in light of a longer wavelength, when two-wavelength multiplexed light comprising light of a shorter wavelength of 1.3 $\mu$m and light of a longer wavelength of 1.55 $\mu$m is irradiated thereonto.

This semiconductor photodetector 10 comprises a substrate 11 of a first conductivity type, and a first light-absorbing layer 13, a buffer layer 15 of a second conductivity type, a second light-absorbing layer 17 of a second conductivity type, and a window layer 19 of a second conductivity type, which are laminated in this order onto a first principal surface 11a of the substrate 11. The first light-absorbing layer 13 is constituted by a layer-shaped region 13x of a first conductivity type and a layer-shaped region 13y of a second conductivity type. Furthermore, in a portion of the window region 19, there is provided a diffused region 21 of a first conductivity type having a depth such that it extends from the upper face of the window layer 19 to the interface between the window layer 19 and the second light-absorbing layer 17, and moreover, a main electrode 23 of a first conductivity type connected electrically to the diffused region 21 is provided on this diffused region 21, and a main electrode 25 of a second conductivity type connected electrically to the window layer 19 is provided on the window layer 19 in the vicinity of the diffused region 21.

In this embodiment, the first conductivity type is p-type and the second conductivity type is n-type. The substrate 11 of the first conductivity type is a $p^+$-InP substrate, the first light-absorbing layer 13 is an InGaAsP layer, the buffer layer 15 is an n-InP layer, the second light-absorbing layer 17 is an $n^-$-InGaAs layer, and the window layer 19 is an $n^-$-Inp layer. The region 13x of the first conductivity type is a p-InGaAsP region, and the region 13y of the second conductivity type is an $n^-$-InGaAsP region. Thereby, a pn junction is formed by means of the region 13x of the first conductivity type and the region 13y of the second conductivity type. Moreover, the diffused region 21 formed in a portion of the n-Inp layer 19 is a $p^+$ diffused region 21.

Moreover, the energy gap wavelength of the second light-absorbing layer 17 in this semiconductor photodetector 10 is longer than the energy gap wavelength of the first light-absorbing layer 13, and the energy gap wavelength of the first light-absorbing layer 13 is longer than the respective energy gap wavelengths of the substrate 11, buffer layer 15 and window layer 19.

Here, the composition of the InGaAsP layer was determined in such a manner that the energy gap wavelength ($\lambda_{g1}$) of the first light-absorbing layer 13 is 1.4 um. Furthermore, the composition of the InGaAs layer is determined in such a manner that the energy gap wavelength ($\lambda_{g2}$) of the second light-absorbing layer 17 is 1.67 $\mu$m. The energy gap wavelength ($\lambda_{g3}$) of the InP forming the buffer layer 15 and the window layer 19 is 0.92 $\mu$m.

Since the semiconductor photodetector 10 according to this embodiment is a rear face exposure-type element, light is incident from the direction of the second principal surface 11b of the substrate 11. Therefore, an antireflection film 29 is provided on the second principal surface 11b of the substrate 11. Here, a silicon nitride film 29 ($Si_3N_4$ film) is used for the antireflection film.

Moreover, an insulating film 31 is formed on the portions of the window layer 19 and the diffused region 21 which are exposed beyond the p-side electrode 23 and the n-side electrode 25. Here, a silicon nitride film 31 ($Si_3N_4$ film) is used for the insulating film (FIG. 1)

Next, a method for manufacturing the semiconductor photodetector 10 in FIG. 1 is described with reference to FIG. 1 and FIGS. 2 (A)–2 (D).

Firstly, a preliminary layer 13a for a first light-absorbing layer of a second conductivity type, a buffer layer 15 of a second conductivity type, a second light-absorbing layer 17 of a second conductivity type and a window layer 19 of a second conductivity type are formed successively on the first principal surface 11a of a substrate 11 of a first conductivity type, by means of a suitable crystal growth method.

Figures 2A, 2B, 2C, 2D:
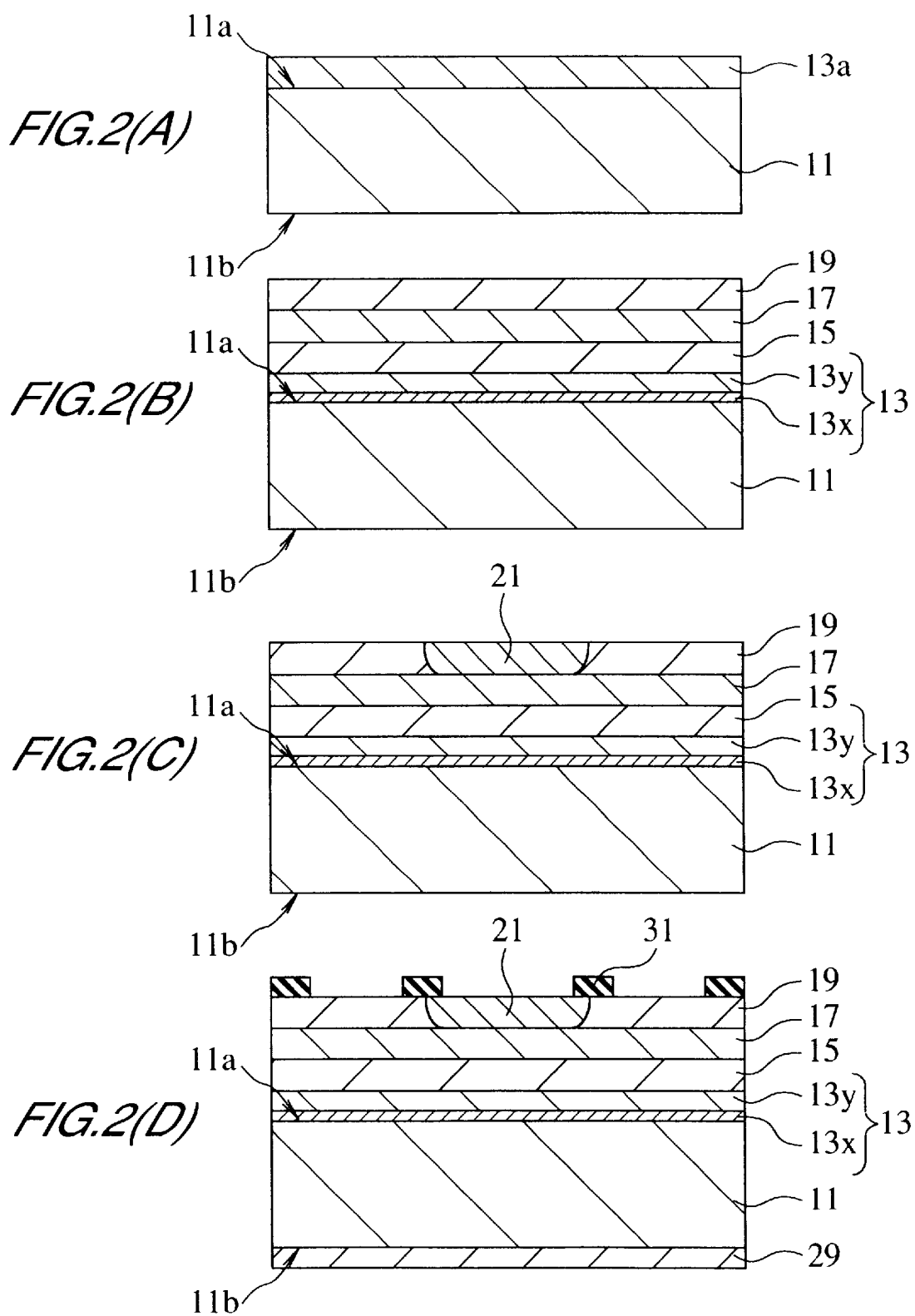
FIG. 2 (comprising FIG. 2(A)–FIG. 2(D)) is a processing diagram for describing one embodiment of a method for manufacturing a semiconductor photodetector according to this invention.

In this example, an n⁻-InGaAsP layer forming the preliminary layer 13a is formed onto a p⁺-InP substrate 11 having an impurity concentration of $1 \times 10^{18}$ cm$^{-3}$ or more, by means of a halide vapour deposition method or MOCVD method (metal organic chemical vapour deposition) (FIG. 2(A)). This preliminary layer 13a eventually forms a first light-absorbing layer 13. The first light-absorbing layer is composed such that it transmits light having a wavelength longer than 1.4 μm in the light incident thereon, and absorbs light having a wavelength shorter than 1.4 μm. Therefore, the preliminary layer 13a is formed with a composition of. (In$_{0.7}$Ga$_{0.3}$As$_{0.65}$P$_{0.35}$) in order that its energy gap wavelength ($\lambda_{g1}$) is 1.4 μm. Furthermore, the thickness of the preliminary layer 13a is set such that the signal selection ratio between the light on the longer wavelength side and the light on the shorter wavelength side in the incident light (longer wavelength : shorter wavelength) is 20–50:1. Here, the light on the longer wavelength side is taken as light of 1.55 μm wavelength and the light on the shorter wavelength side is taken as light of 1.3 μm wavelength, so preliminary layer 13a is grown to a thickness whereby the aforementioned selection ratio (1.55 μm light:1.3 μm light) is 20–50:1. Consequently, the thickness of this layer is set to 2–3 μm, for example.

Next, an n-Inp layer is formed on the preliminary layer 13a as a buffer layer 15. Here, it is grown to a thickness of 1–2 μm, for example.

Thereupon, an n⁻-InGaAs layer is formed as the second light-absorbing layer 17 on the n-InP layer 15. The second light-absorbing layer 17 is formed with a composition of (In$_{0.53}$Ga$_{0.47}$As) in order that its energy gap wavelength ($\lambda_{g2}$) is 1.67 μm. This second light-absorbing layer 17 transmits light having a wavelength longer than 1.67 μm contained in the light incident thereon, and it absorbs light having a lower wavelength. In this example, the second light-absorbing layer 17 is grown to a thickness of 2–3 μm, for example.

Thereupon, an n⁻-Inp layer is formed as a window layer 19 of a second conductivity type on the n⁻-InGaAs layer 17. Here, a structure as illustrated in FIG. 2(B) is obtained by growing the window layer 19 to a thickness of 1–2 μm, for example.

Next, an impurity of a first conductivity type is diffused in a portion of the window layer 19 from the upper face of the window layer 19, thereby forming a diffused region 21 having a depth extending to the interface between the window layer 19 and the second light-absorbing layer 17 (FIG. 2(C)).

In this compositional example, a crystal growth temperature, in other words, a substrate heating temperature, of 600–700° C. is used in the crystal growth processing for the preliminary layer (n⁻-InGaAsP layer) 13a onto the substrate 11, the buffer layer (n-InP layer) 15, the second light-absorbing layer (n⁻-InGaAs layer) 17 and the window layer (n-InP) 19. Therefore, by the completion of the crystal growth processing, p-type impurity, such as Zn, for example, will have diffused thermally from the p⁺-InP substrate 11 into the n⁻-InGaAsP layer to a depth of approximately 0.5 μm, and a p-type region 13x (p-InGaAsP region) having a thickness of approximately 0.5 μm will form in the region of the n⁻-InGaAsP layer adjacent to the substrate 11. Consequently, the first light-absorbing layer 13 is constituted by a p-InGaAsP region 13x and an n⁻-InGaAsP region 13y into which the impurity is not diffused, and hence a pn junction region is created in-side the first light-absorbing layer 13.

Here, by diffusing an acceptor impurity, such as Zn or Cd, into a portion of the n-Inp layer forming the window layer 19, a p⁺ diffused region 21 is formed. This diffusion is carried out by means of a thermal diffusion method, for example. In this case, Zn$_3$P$_2$, for example, is used as the diffusion source, and is diffused thermally for 30 minutes at a temperature of 500° C. Thereby, a p⁺ diffused region 21 is formed to a depth extending to the surface of the second light-absorbing layer 17 which is located below the window layer 19.

Next, in this embodiment, an antireflection film 29 is formed by plasma CVD onto the second principal surface 11b of the substrate 11. Here, an Si$_3$N$_9$ film is used for the antireflection film 29 (FIG. 2(D)).

Moreover, an insulating film 31 is formed over the window layer 19 and the p⁺ diffused region 21 on the first principal surface 11a side of the substrate 11. Here, an Si$_3$N$_4$ film is used for the insulating film 31, which is formed by plasma CVD. This insulating film 31 is provided with windows for forming electrodes, whereby the window layer 19 and the p⁺ diffused region 21 are each partially exposed (FIG. 2(D)).

Thereupon, a main electrode 23 of a first conductivity type is fabricated on a portion of the diffused region 21, whilst at the same time a main electrode 25 of a second conductivity type is fabricated on a portion of the window layer 19 where the diffused region 21 is not formed. (FIG. 1)

In this embodiment, by using a common technique, such as photolithography and subsequent etching, or the like, the insulating film 31 over the portion of the p⁺ diffused region 21 on which the main electrode 23 of the first conductivity type is provided is removed, whilst at the same time the insulating film 31 over the portion of the window layer 19 on which the main electrode 25 of the second conductivity type is provided is also removed. After this, the p side electrode 23 is formed on the p⁺ diffused region 21 where the insulating film 31 was removed, whilst at the same time the n side electrode 25 is formed on the window layer 19 where the insulating film 31 was removed.

Thereby, a rear face exposure-type semiconductor photodetector (or photo detecting element) 10 according to this embodiment is obtained.

Two-wavelength multiplexed light having light wavelengths of 1.3 μm and 1.55 μm is directed onto the semiconductor photodetector 10. Here, the light is incident via the second principal surface 11b of the p⁺-InP substrate 11. The incident light first reaches the first light-absorbing layer 13 (InGaAsP layer). Since the energy gap wavelength ($\lambda_{g1}$) of the first light-absorbing layer 13 is 1.4 μm, the light having a wavelength of 1.3 μm is absorbed by the first light-absorbing layer 13. The light having a wavelength of 1.55 μm is transmitted. Thereupon, the light having a wavelength of 1.55 μm reaches the second light-absorbing layer 17 (n⁻-InGaAs layer). Since the energy gap wavelength (g2) of the second light-absorbing layer 17 is 1.67 μm, the light having a wavelength of 1.55 μm is absorbed by this second light-absorbing layer 17. The optical signal having a wavelength of 1.55 μm absorbed by the second light-absorbing layer 17 is converted to an electrical signal by a photoelectric effect and extracted by the p-side electrode 23 provided on the upper side of the second light-absorbing layer 17 via the p⁺ diffused region 21, and the n-side electrode 25 provided via the window layer 19.

On the other hand, carriers generated by the light of 1.3 μm wavelength absorbed by the first light-absorbing layer 13 are trapped in the pn junction region formed within the first light-absorbing layer 13. Thereby, the carriers originating in the light of 1.3 µm wavelength do not reach to the window layer 19 and diffused region 21 which are located above the second light-absorbing layer 17, and consequently they are not output via the p-side electrode 23 and n-side electrode 25.

Therefore, if multiplex optical communications using two different wavelengths is carried out using the semiconductor photodetector 10 according to this embodiment, firstly, the light on the shorter wavelength side is absorbed by the first light-absorbing layer 13, and the light on the longer wavelength side is transmitted thereby. Thereupon, the light on the longer wavelength side is absorbed by the second light-absorbing layer 17 and this light is readily extracted in the form of an electrical signal by selective photoelectric conversion of the light. Moreover, a pn junction region is formed in-side the first light-absorbing layer 13 and carriers generated by light on the shorter wavelength side are trapped therein. Therefore, it is possible to shut out light on the shorter wavelength side by means of the first light-absorbing layer 13. Consequently, there is no risk of noise, or the like, caused by the light on the shorter wavelength side entering into the electrical signal extracted by the electrodes.

Furthermore, the structure for shielding the light on the shorter wavelength side is, for example, composed of InGaAsP, and the other layers are composed of InP and InGaAs. In this way, rather than using a short-wavelength shielding filter, the structure for shutting out the light of shorter wavelength can be formed as a part of the laminated structure constituting the photodetector, using a material which does not produce a large disparity in coefficient of expansion with respect to the other layers. Therefore, problems involved in processing can be avoided, and there is no risk that the structural or operational reliability of the photodetector will be degraded. Moreover, since the structure of this photodetector can be obtained readily by means of a continuous series of manufacturing steps, there is no requirement for complex equipment or processing. Consequently, there is no increase in costs.

Figure 7:
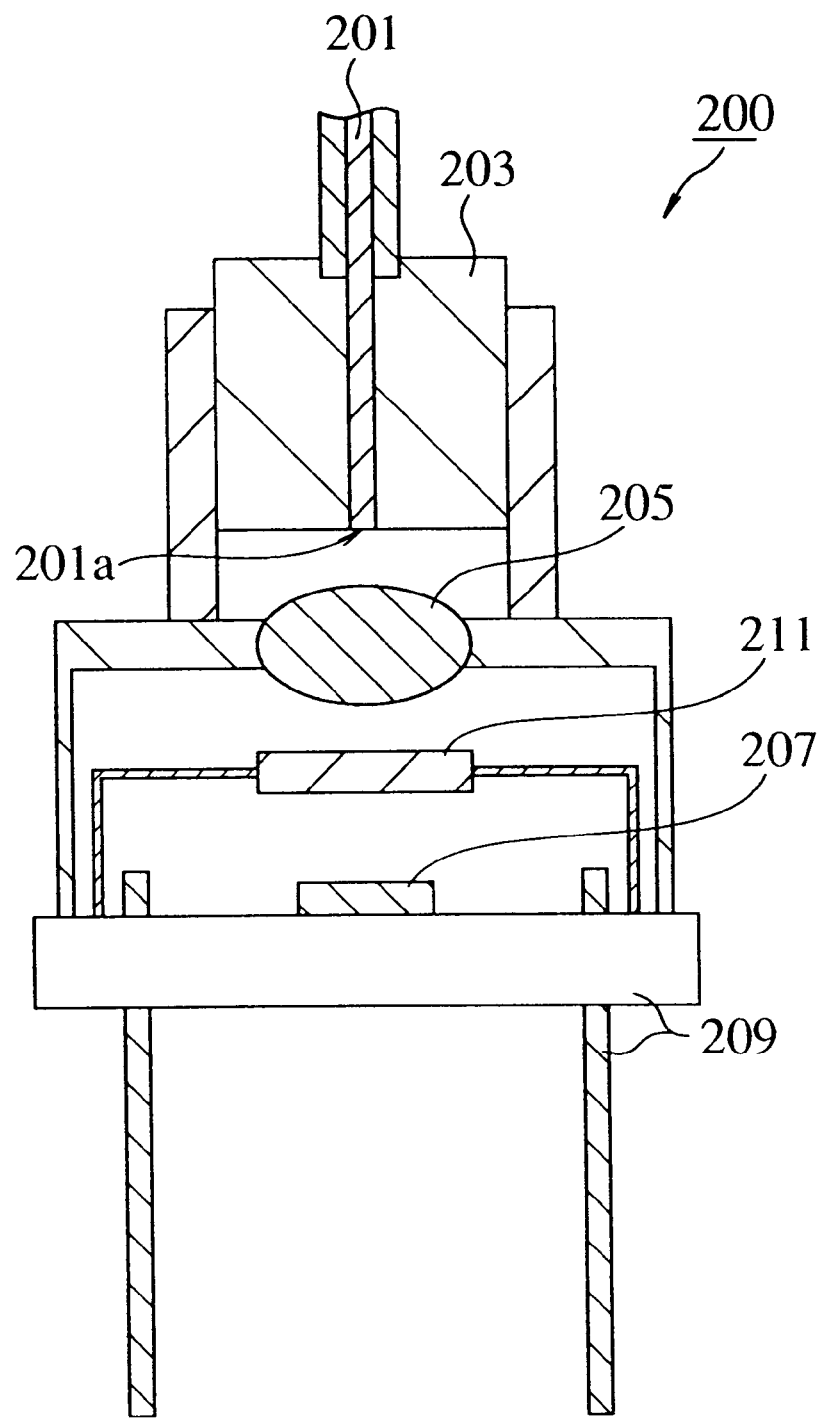
FIG. 7 is a diagram schematically showing the structure of a photodetector module according to this invention and the prior art.

Furthermore, if the semiconductor photodetector 10 according to the embodiment of the present invention described above is used in place of the photodetector 207 in the photodetector module 200 previously described with reference to FIG. 7, then since it is not necessary to provide a short-wavelength shielding filter, the photodetector can be mounted in a module in a similar manner to a conventional module structure. Therefore, there is no risk that the costs involved in the module structure will increase. The structure of the module itself is similar to a conventional module, so description thereof is omitted here.

Moreover, conventionally, there has been a possibility that light reflected at the surface of the short-wavelength shielding filter may return to the transmitting side as back-reflected light, which is a cause of noise, thereby impairing the reliability of the system, but by using the semiconductor photodetector according to this embodiment, since it is not necessary to provide a short-wavelength shielding filter, it is possible to prevent degradation of system reliability caused by back-reflected light. Moreover, since no filter is used, it is also possible to prevent attenuation of the light on the longer wavelength side which is transmitted by the filter. Therefore, the risk of signal deterioration caused by the short-wavelength shielding filter is eliminated.

Second Embodiment

Figure 3:
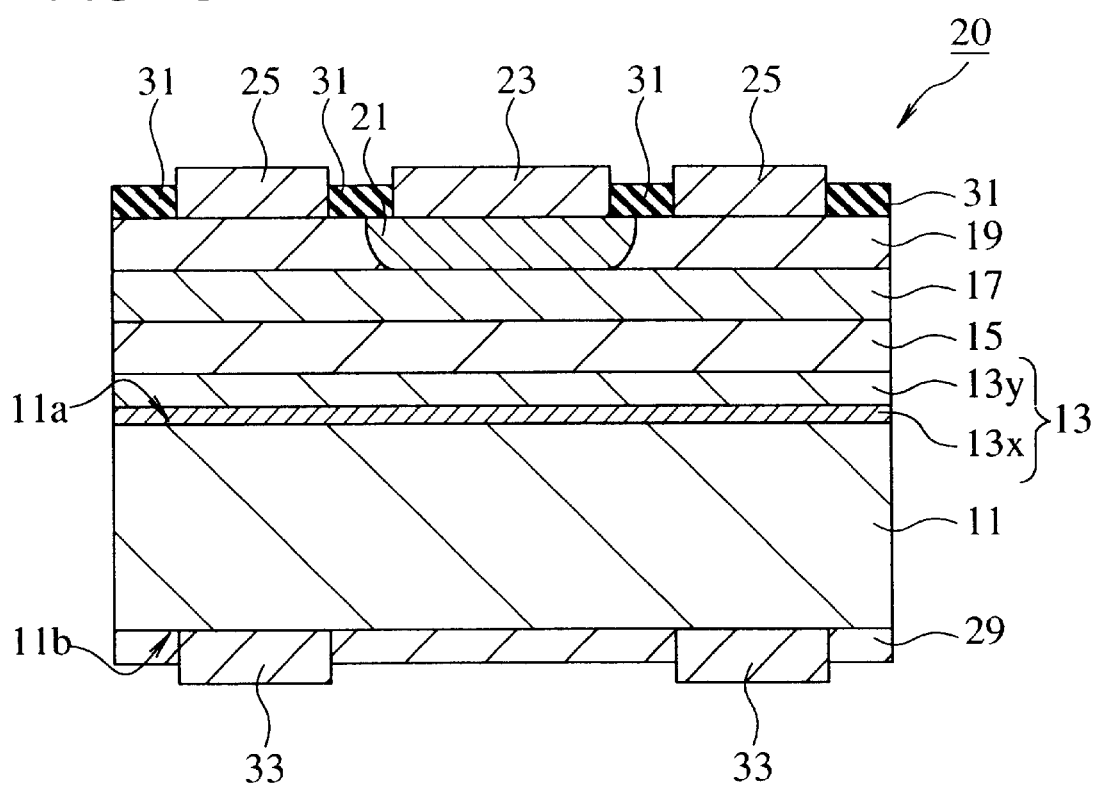
FIG. 3 is a sectional view schematically showing the general structure of a second embodiment of the semiconductor photodetector according to this invention.
Figure 4:
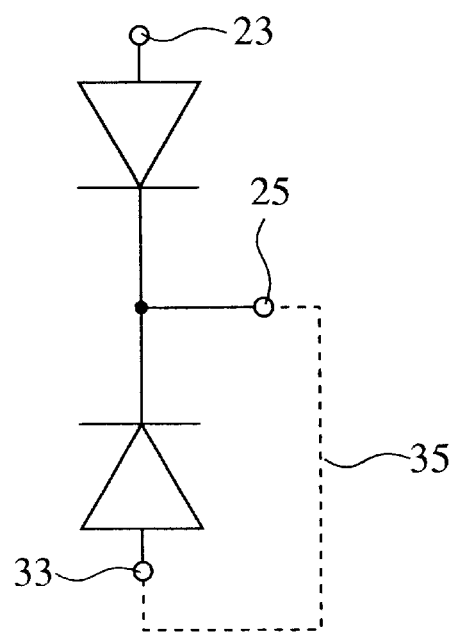
FIG. 4 is a schematic connection diagram of a photodetector according to a second embodiment of this invention.

Next, a second embodiment of the present invention is described with reference to FIG. 3 and FIG. 4. FIG. 3 is a general view schematically showing the composition of a semiconductor photodetector according to this embodiment, and it shows a sectional view of the element. FIG. 4 is a schematic connection diagram of the photodetector according to this embodiment.

Below, as this second embodiment of the invention, a description will be given of a photodetector provided with an auxiliary electrode of a first conductivity type on the second principal surface side of the substrate of the semiconductor photodetector according to the first embodiment. This description covers the points which differ from the first embodiment, whilst those points which are the same as the first embodiment are not described in detail here.

Similarly to the first embodiment, the purpose of the element according to this embodiment is to extract light on the longer wavelength side as an electrical signal by photoelectric conversion, from input two-wavelength multiplexed light comprising light having a wavelength of 1.3 µm and light having a wavelength of 1.55 µm.

Similarly to the first embodiment, this semiconductor photodetector 20 comprises a first light-absorbing layer 13 (InGaAsP layer), a buffer layer 15 of a second conductivity type (n-InP layer), a second light-absorbing layer 17 of a second conductivity type (n⁻-InGaAs layer) and a window layer 19 of a second conductivity type (n⁻Inp layer), which are laminated in this order onto a first principal surface 11a of a substrate 11 of a first conductivity type (p⁺-InP substrate). The first light-absorbing layer 13 comprises a region 13x of the first conductivity type (p-InGaAsP region) and a region 13y of the second conductivity type (n⁻-InGaAsP region). Furthermore, a diffused region 21 of the first conductivity type (p⁺ diffused region) having a depth extending from the upper face of the window layer 19 to the interface between the window layer 19 and the second light-absorbing layer 17 is provided in a portion of the window layer 19. A main electrode 23 of a first conductivity type (p-side electrode), which is connected electrically to the diffused region 21, is provided on this diffused region 21, and a main electrode 25 of a second conductivity type (n-side electrode), which is electrically connected to the window layer 19, is provided on the window layer 19 in the vicinity of the diffused region 21 (FIG. 3).

Furthermore, in this embodiment, an auxiliary electrode 33 of the first conductivity type (p type) is provided on the second principal surface 11b of the p⁺-InP substrate 11 (FIG. 3), and wiring 35 which provides a shorting connection between this auxiliary electrode 33 of the first conductivity type and the main electrode 25 of the second conductivity type (n type) is formed, as illustrated by the broken line in FIG. 4.

Moreover, similarly to the first embodiment, the energy gap wavelength ($\lambda_{g1}$) of the second light-absorbing layer 17 (n-InGaAsP layer) is set to 1.67 µm, which is longer than the energy gap wavelength ($\lambda_{g2}$) of the first light-absorbing layer 13 (n⁻-InGaAsP layer), which is 1.4 µm. Also, the energy gap wavelength of the first light-absorbing layer 13 is longer than the respective energy gap wavelengths of the substrate 11, buffer layer 15 and window layer 19.

Moreover, an antireflection film 29 composed of a silicon nitride film is formed on the second principal surface 11b of the substrate 11. This antireflection film 29 is provided in such a manner that the auxiliary electrode 33 of the first conductivity type provided on the second principal surface 11b is exposed through the antireflection film 29.

The semiconductor photodetector 20 according to this second embodiment may be manufactured by the method already described with reference to the first embodiment, for example. After forming the antireflection film 29, an opening through which the substrate 11 is exposed is provided in this film 29 in the region allocated for electrode forming, and the auxiliary electrode 33 of the first conductivity type (p-side auxiliary electrode) may be formed via this opening onto the second principal surface 11b of the substrate 11, by vapour deposition or another commonly used electrode forming method. The forming process for this electrode 33 may be carried out simultaneously with the formation of the main electrodes 23 and 25 of the first and second conductivity types. Moreover, when the element 20 is mounted, wiring or interconnection is provided such that a shorting connection is made between the n-side electrode 25 and the p-side auxiliary electrode 33, as illustrated in FIG. 4.

Two-wavelength multiplexed light comprising light of 1.3 $\mu$m wavelength and light of 1.55 $\mu$m wavelength enters the semiconductor photodetector 20 according to this second embodiment, via the second principal surface 11b of the substrate 11. The incident light passes through the substrate 11, and the light having a wavelength of 1.3 $\mu$m (hereinafter, called light on the shorter wavelength side), which is less than the energy gap wavelength of the first light-absorbing layer 13, is absorbed by the first light-absorbing layer 13. The light having a wavelength of 1.55 $\mu$m (hereinafter, called light on the longer wavelength side,) which is longer than the energy gap wavelength of the first light-absorbing layer 13, passes through this layer 13. Thereupon, the light on the longer wavelength side is transmitted by the buffer layer 15 and reaches the second light-absorbing layer 17 which has an energy gap wavelength of 1.67 $\mu$m, and it is absorbed by this layer 17. The absorbed light signal of 1.55 $\mu$m wavelength is converted photoelectrically in the pn junction region constituted by the n-type second light-absorbing layer 17 and the $p^+$ diffused region 21 which connected to this layer 17, and it is extracted by the p-side electrode 23 and the n-side electrode 25 as an electrical signal.

Furthermore, the carriers generated by the light on the shorter wavelength side absorbed by the first light-absorbing layer 13 are trapped in the pn junction region formed in-side the first light-absorbing layer 13. These trapped carriers flow as a shorting current along the wiring which provides a shorting connection between the p-side auxiliary electrode 33 and the n-side electrode 25. Therefore, it is possible for the carriers to be removed from the photodetector 20, rather than accumulating in the pn junction region. Therefore, the carriers originating in the light having a wavelength of 1.3 $\mu$m are not transferred towards the second light-absorbing layer 17 and the $p^+$ diffused region 21, and there is no risk of these carriers having an adverse effect on the extracted electrical signal.

Therefore, similarly to the first embodiment, there is no risk that noise, or the like, caused by light on the shorter wavelength side will become admixed into the longer wavelength electrical signal extracted by the electrodes (23 and 25).

Moreover, in the semiconductor photodetector 20 according to this embodiment, since carriers generated by the light on the shorter wavelength side is eliminated without accumulating in the pn junction region, it is possible to reduce further any adverse effects due to the aforementioned carriers on the extracted longer wavelength electrical signal or the photodetector itself.

Furthermore, similarly to the first embodiment, it is possible to form a structure for shielding the light on the shorter wavelength side as a portion of the laminated structure constituting the photodetector, without using a short-wavelength shielding filter. Therefore, it is possible to avoid problems in processing, and there is no risk that the structural or operational reliability of the photodetector will be degraded. Moreover, since the structure of this photodetector can be manufactured readily by means of a continuous series of manufacturing steps, it is not necessary to use complex equipment or processing. Consequently, there are no corresponding increases in cost.

Furthermore, if the semiconductor photodetector is used as a photodetector in a photodetector module, then since it is not necessary to provide a short-wavelength shielding filter, it is possible to install the photodetector in the module in a similar manner to a conventional module structure. Consequently, there is no risk that costs relating to module manufacture will rise.

Moreover, conventionally, there has been a possibility that light reflected at the surface of the short-wavelength shielding filter will return to the transmitting side as back-reflected light which may cause noise, thereby impairing the reliability of the system, but if the semiconductor photodetector according to this embodiment is used, since it is not necessary to provide a short-wavelength shielding filter, then it is possible to prevent deterioration in the reliability of the system caused by this back-reflected light. Furthermore, since no filter is used, it is possible to prevent attenuation of the light on the longer wavelength side transmitted by the filter. Consequently, there is no risk of signal degradation caused by the short-wavelength shielding filter.

Third Embodiment

Figure 5:
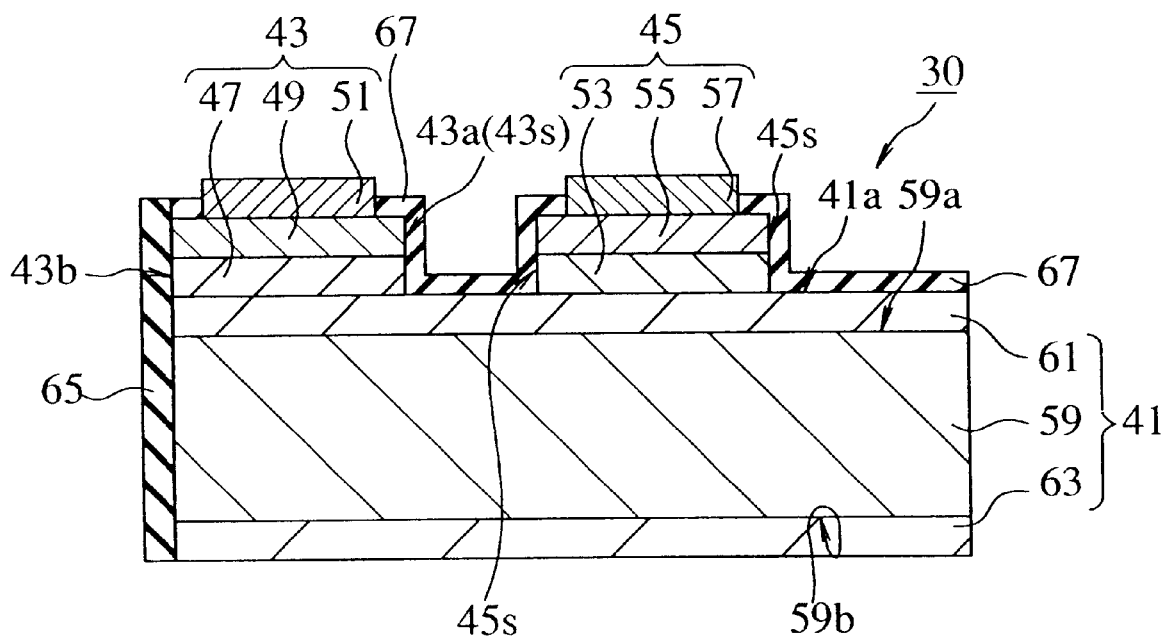
FIG. 5 is a sectional view schematically showing the general structure of a third embodiment of the semiconductor photodetector according to this invention.
Figure 6:
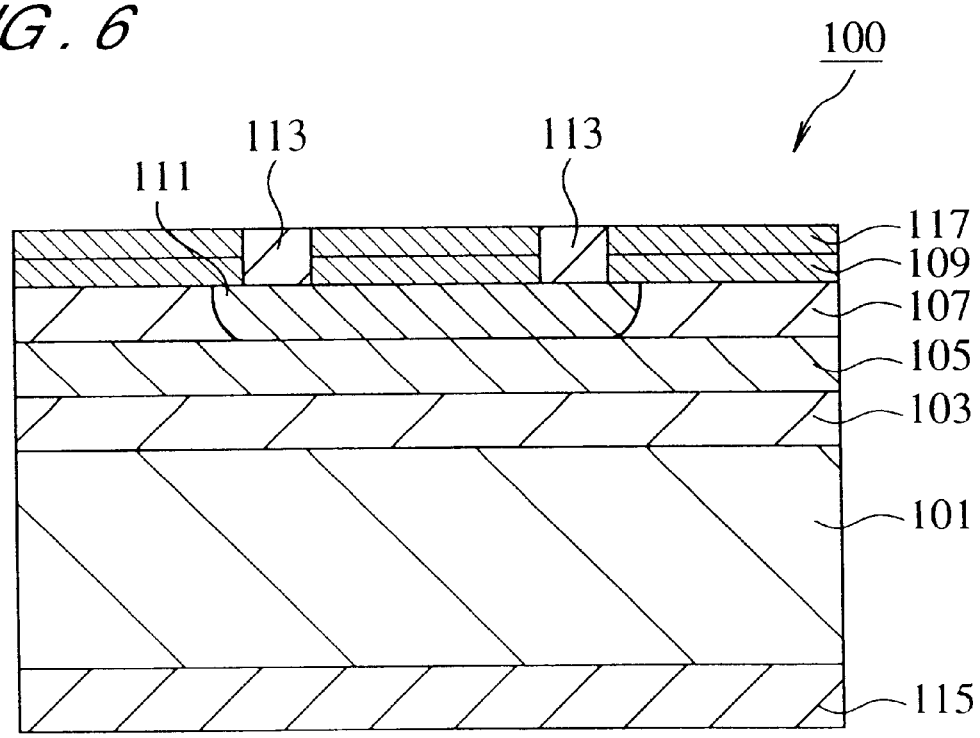
FIG. 6 is a diagram schematically showing the structure of a conventional semiconductor photodetector.

As a third embodiment, a description is now given of an example where this invention is applied to an end face exposure wave guide-type photodetector, with reference to FIG. 5.

FIG. 5 is a schematic diagram showing the composition of a semiconductor photodetector according to this embodiment, and it shows a cross-section in the direction of travel of the incident light.

The photodetector 30 according to this embodiment comprises an underlying layer 41, and a first wave guide section 43 and a second wave guide section 45 having a mesa shape, provided on the first principal surface 41a of the underlying layer 41, in a consecutive fashion in the direction of travel of the incident light. As the first wave guide section 43, a first light-absorbing layer 47 of a first conductivity type, a first window layer 49 of a second conductivity type, and a first electrode 51 of a second conductivity type are laminated in this order onto the first principal surface 41a of the underlying layer 41. Moreover, as the second wave guide section 45, a second light-absorbing layer 53 of a first conductivity type, a second window layer 55 of a second conductivity type, and a second electrode 57 of a second conductivity type are laminated thereon, in this order. The underlying layer 41 comprises a substrate 59 of a first conductivity type, a buffer layer 61 of a first conductivity type laminated onto the first principal surface 59a of this substrate 59, and a third electrode 63 of the first conductivity type provided on the second principal surface 59b of the substrate 59.

Here, the first conductivity type is n-type and the second conductivity type is p-type.

Firstly, the underlying layer 41 comprises an $n^+$-InP substrate as the substrate 59 of the first conductivity type, an n-Inp layer as the buffer layer 61 provided on the first principal surface 59a of the substrate 59, and an n-side third electrode as the third electrode 63 of the first conductivity type provided in contact with the second principal surface 59b of the substrate 59. In this example, the first wave guide section 43 and second wave guide section 45 are provided in a consecutive linear fashion in the direction of travel of the incident light on the first principal surface 41a of the underlying layer 41, in other words, the surface of the n-InP layer 61. Furthermore, the first light-absorbing layer 47 is an n$^-$-InGaAsP layer, the first window layer 49 is a p-InP layer, and the first electrode 51 of the second conductivity type is a p-side the first electrode. Moreover, the second light-absorbing layer 53 is an n$^-$-InGaAs layer, the second window layer 55 is a p-InP layer, and the second electrode 57 of the second conductivity type is a p-side second electrode.

The energy gap wavelength of the second light-absorbing layer 53 is set such that it is longer than the energy gap wavelength of the first light-absorbing layer 47, and the energy gap wavelength of the first light-absorbing layer 47 is set such that it is longer than the respective energy gap wavelengths of the substrate 59, buffer layer 61, and the first and second window layers (49, 55).

In this example, similarly to the first and second embodiments, the InGaAsP layer composition is set to $In_{0.7}Ga_{0.3}As_{0.65}P_{0.3}S$ in order that the energy gap wavelength of the first light-absorbing layer 47 is 1.4 $\mu$m. Furthermore, the composition of the InGaAs layer is set to $In_{0.53}Ga_{0.4}As$ in order that the energy gap wavelength ($\lambda_{g2}$) of the second light-absorbing layer 53 is 1.67 $\mu$m. The energy gap wavelength ($\lambda_{g3}$) of the InP constituting the substrate 59, buffer layer 61 and the first and second window layers (49, 55) is set to 0.92 $\mu$m.

The incident light enters from the end face 43b of the first wave guide section 43 which is opposite to the end face 43a thereof adjacent to the second wave guide section 45.

The antireflection film 65 is formed on the incident end face 43b of the incident light at the first wave guide section 43, and here, the antireflection film 65 is constituted by a silicon nitride film ($Si_3N_4$ film). The region of the first principal surface 41a of the underlying layer 41 apart from the regions where the first wave guide section 43 and the second wave guide section 45 are formed, and the side faces (43s, 45s) of the mesa-shaped first and second wave guide sections (43, 45), are protected by an insulation film 67. This insulation film 67 is, for example, an $Si_3N_4$ film.

Moreover, in manufacturing the semiconductor photodetector 30 according to this embodiment, each layer constituting the underlying layer 41 and the wave guide sections (43, 45) are deposited by means of a suitable crystal growth technique, such as a halide vapour deposition method or MOCVD method. Also, the first and second wave guide sections (43, 45) are formed in prescribed mesa shapes by means of a commonly used dry-etching technique or wet-etching technique.

Furthermore, in the first wave guide section 43, the layers where the side faces are exposed to form a wave guide section are, at the least, the first light-absorbing layer 47 and the layer positioned there above. Since the first light absorbing layer 47 should be exposed, at the least, the side faces of the layers positioned below the first light-absorbing layer 47 may also be exposed. Similarly, in the second wave guide section 45, at the least, the second light-absorbing layer 53 and the layers positioned above this layer should be exposed.

Two-wavelength multiplexed light comprising light having a wavelength of 1.3 $\mu$m and light having a wavelength of 1.55 $\mu$m enters the semiconductor photodetector according to this third embodiment from the incident end face 43b of the first wave guide section 43. Of the incident light, firstly, the light of 1.3 $\mu$m wavelength is absorbed by the first light-absorbing layer 47. The light of 1.55 $\mu$m wavelength is transmitted by the first light-absorbing layer 47. In other words, it is transmitted through the first wave guide section 43. Thereafter, the light having a wavelength of 1.55 $\mu$m reaches the second light-absorbing layer 53 of the second wave guide section 45, and it is absorbed by this second light-absorbing layer 53.

Consequently, the light of 1.3 $\mu$m wavelength absorbed by the first light-absorbing layer 47 is photoelectrically converted in the pn junction region formed by the n-type first light-absorbing layer 47 and the p-type first window layer 49 provided in contact with this layer 47, and it can be extracted via the p-side first electrode 51 and n-side third electrode 63 as a shorter wavelength side electrical signal. Moreover, the light of 1.55 $\mu$m wavelength absorbed by the second light-absorbing layer 53 is photoelectrically converted in the pn junction region formed by the n-type second light-absorbing layer 53 and the p-type second window layer 55, and it is extracted via the p-side second electrode 57 and the n-side third electrode 63 can be extracted as a longer wavelength side electrical signal.

Therefore, by using the semiconductor photodetector according to this embodiment in two-wavelength multiplex optical communications, the light on the shorter wavelength side and the light on the longer wavelength side are each photoelectrically converted, selectively, and respective electrical signals can be extracted via the different electrodes in the same element. Therefore, in order to extract a signal corresponding to the light of one wavelength, it is not necessary to provide a filter for shielding the light of the other wavelength, and therefore, as described previously in the first and second embodiments, there is no risk that the structural and operational reliability of the photodetector will be degraded. Moreover, no equipment or processing for providing a filter is necessary, and consequently, there is no risk of an increase in costs.

According to this embodiment, since signals corresponding to light of two wavelengths can be obtained simultaneously in a single photodetector, it is possible to achieve a reduction in the number of processes for extracting signals and savings in the time and costs required to obtain signals.

Furthermore, in cases where multiplexed light containing more wavelengths than two wavelengths is used in the incident light, it is possible to provide a number of wave guide sections on the first principal surface area of the underlying layer which corresponds approximately to the number of wavelengths contained in the incident light. By adopting this composition, the light contained in the incident light is photoelectrically converted respectively at each of the wave guide sections, and can be extracted separately as electrical signals originating in the separate wavelengths.

The first and second embodiments related to a description of a rear face exposure-type semiconductor photodetector, but the invention is not limited to this, and by providing a first light-absorbing layer on the surface side and a second light-absorbing layer on the rear face, it is possible to apply this invention also to a surface exposure-type semiconductor photodetector.

As the foregoing description reveals, in the semiconductor photodetector according to the invention, a first light-absorbing layer, a buffer layer of a second conductivity type, a second light-absorbing layer of a second conductivity type, and a window layer of a second conductivity type are laminated, in this order, onto the first principal surface a substrate of a first conductivity type. The first light-absorbing layer contains a region of a first conductivity type and a region of a second conductivity type. A diffused region of a first conductivity type having a depth extending from the upper face of the window layer to the interface between the window layer and the second light-absorbing layer is provided in a portion of the window layer. Moreover, a main electrode of a first conductivity type, which is electrically connected to this diffused region, is provided on the diffused region, and a main electrode of a second conductivity type, which is electrically connected to this window, is provided on the window layer in the vicinity of the diffused region. Moreover, in this semiconductor photodetector, the energy gap wavelength of the second light-absorbing layer is longer than the energy gap wavelength of the first light-absorbing layer, and the energy gap wavelength of the first light-absorbing layer is longer than the respective energy gap wavelengths of the substrate, buffer layer and window layer. Thereby, for example, if light comprising two different wavelengths is input via the second principal surface side of the substrate in this semiconductor photodetector, then light having a wavelength shorter than the energy gap wavelength of the first light-absorbing layer is absorbed by this first light-absorbing layer. Light having a wavelength greater than this energy gap wavelength is transmitted. Light on the longer wavelength side transmitted by the first light-absorbing layer is absorbed by the second light-absorbing layer. The light on the longer wavelength side absorbed by the second light-absorbing layer is extracted as an electrical signal via a main electrode of a first conductivity type and a main electrode of a second conductivity type, by means of a photoelectric effect.

Moreover, the carriers generated by the light of shorter wavelength absorbed by the first light-absorbing layer are trapped in the pn junction region formed by the region of a first conductivity type and the region of a second conductivity type. Therefore, these carriers do not reach the second light-absorbing layer. Consequently, it is possible to extract an electrical signal corresponding to the light on the longer wavelength side only, which does not contain an electrical signal corresponding to the light of shorter wavelength.

Moreover, the structure for shutting out the light of shorter wavelength can be formed by a portion of the laminated structure constituting the photodetector, without using a short-wavelength filter. Therefore, it is possible to prevent problems relating to processing, and there is no risk that the structural and operational reliability of the photodetector will be degraded. Also, since the structure of this photodetector can be manufactured readily by means of a continuous series of manufacturing steps, no complicated equipment or processing is required, and hence there is no risk of an increase in costs.

Furthermore, the process of manufacturing the semiconductor photodetector comprises the steps of: forming a preliminary layer for a first light-absorbing layer of a second conductivity type, a buffer layer of a second conductivity type, a second light-absorbing layer of a second conductivity type and a window layer of a second conductivity type, by laminating these layers respectively in this order onto the first principal surface of a substrate of a first conductivity type: forming a diffused region having a depth extending to the interface between the window layer and the second light-absorbing layer by diffusing an impurity of the first conductivity type into a portion of the window layer; and forming a main electrode of a first conductivity type on a portion of the diffused region, whilst simultaneously forming a main electrode of a second conductivity type on a portion of the remainder of the window layer.

When this semiconductor photodetector is used in two wavelength multiplex optical communications, the energy gap wavelength of the preliminary layer is set such that it is shorter than the energy gap wavelength of the second light-absorbing layer. Moreover, the energy gap wavelength of the preliminary layer is set such that it is longer than the respective energy gap wavelengths of the substrate, buffer layer, and window layer. The energy gap wavelength is adjusted by altering the composition of the semiconductor material constituting the layers, for example. Furthermore, the energy gap wavelength of the preliminary layer is longer than the wavelength of light on the shorter wavelength side contained in the incident light, whilst it is shorter than the wavelength of light on the longer wavelength side. The energy gap wavelength of the second light-absorbing layer is longer than the light on the longer wavelength side in the incident light. In this way, a photodetector can be manufactured, whereby in two-wavelength multiplex optical communications, the light on the shorter wavelength side is absorbed by the first light-absorbing layer, whilst the light on the longer wavelength side is absorbed by the second light-absorbing layer, and the electrical signal originating in the light on the longer wavelength side can be extracted alone. Moreover, if a preliminary layer for a first light-absorbing layer of the second conductivity type is formed on the first principal surface of the substrate, then the impurity of the first conductivity type will diffuse from the substrate into the region of the preliminary layer adjacent to the substrate, thereby forming the region of the preliminary layer adjacent to the substrate into a region of the first conductivity type. The region of the preliminary layer into which the impurity does not become diffused forms a region of the second conductivity type. Thereby, a first light-absorbing section is formed by the region of the first conductivity type and the region of the second conductivity type. Moreover, a pn junction region is formed between the region of the first conductivity type and the region of the second conductivity type. Carriers generated by the light of shorter wavelength absorbed by the first light-absorbing layer can be trapped by means of this pn junction region. Therefore, it is possible to suppress any adverse effect of carriers originating in the light on the shorter wavelength side with respect to the electrical signal originating in the light on the longer wavelength side which is to be extracted ultimately.

Furthermore, by adopting this method for manufacture, since it is not necessary to provide a short-wavelength shielding filter which is made from a different material to the material constituting the photodetector, there is no risk that the structural or operational reliability of the photodetector will be degraded. Moreover, special equipment for installing the filter becomes unnecessary, so it is possible to avoid further complication of the manufacturing process, and hence the costs involved in the manufacture of the photodetector can be reduced.

Furthermore, in a photodetector module, desirably, a semiconductor photodetector such as that described above should be employed. Such a photodetector module may comprise, for example, an optical fiber, a ferrule supporting this optical fiber in the center thereof, a lens for focusing light emitted from the optical fiber, a semiconductor photodetector onto which the focused light is irradiated, and a header for fixing the photodetector. A semiconductor photodetector according to this invention is used as the semiconductor photodetector. If this module is used as a module for two-wavelength multiplex optical communications, then it is possible to extract an electrical signal relating to the light on the longer wavelength side readily, without providing a short-wavelength shielding filter between the lens and the photodetector. Moreover, since it is not necessary to provide a filter, there no risk either that light reflected at the filter will return to the transmitting side as back-reflected light. Therefore, it is possible to prevent deterioration in the reliability of the optical communications system. Moreover, since there is also no attenuation of the light on the longer wavelength side, which is to be extracted, on passing through a filter, then it is possible to prevent signal degradation caused by a filter.

What is claimed is:

1. A semiconductor photodetector comprising:

a first light-absorbing layer, a buffer layer of a second conductivity type, a second light-absorbing layer of a second conductivity type and a window layer of a second conductivity type laminated in said order onto a first principal surface of a substrate of a first conductivity type;

said first light-absorbing layer comprising a region of a first conductivity type and a region of a second conductivity type provided in a laminated fashion in said order from the substrate;

a diffused region of a first conductivity type having a depth extending from the upper face of said window layer to the interface between said window layer and said second light-absorbing layer, being provided in a portion of said window layer;

a main electrode of a first conductivity type, electrically connected to said diffused region, being provided on said diffused region;

a main electrode of a second conductivity type, electrically connected to said window region, being provided on said window region;

an auxiliary electrode of a first conductivity type provided on a second principal surface of said substrate; and an interconnection for providing a shorting connection between said auxiliary electrode of a first conductivity type and said main electrode of a second conductivity type, said interconnection making a potential of said main electrode of a second conductivity type equal to a potential of said auxiliary electrode of a first conductivity type;

wherein the energy gap wavelength of said second light-absorbing layer is longer than the energy gap wavelength of said first light-absorbing layer, and the energy gap wavelength of said first light-absorbing layer is longer than the respective energy gap wavelengths of said substrate, buffer layer and window layer.

2. A semiconductor photodetector comprising:

a first wave guide section and a second wave guide section provided on a first principal surface of an underlying layer, in a consecutive fashion in the direction of travel of incident light;

wherein said first wave guide section is provided by laminating, at the least, a first light-absorbing layer of a first conductivity type, a first window layer of a second conductivity type and a first electrode of a second conductivity type onto said first principal surface, in said order;

said second wave guide section is provided by laminating, at the least, a second light-absorbing layer of a first conductivity type, a second window layer of a second conductivity type and a second electrode of a second conductivity type onto said first principal surface, in said order; and said underlying layer comprises a substrate of a first conductivity type, a buffer layer of a first conductivity type laminated onto the first principal surface of said substrate, an insulation film on said buffer layer, and a third electrode of a first conductivity type provided on a second principal surface of said substrate;

wherein the energy gap wavelength of said second light-absorbing layer is greater than the energy gap wavelength of said first light-absorbing layer, the energy gap wavelength of said first light-absorbing layer is greater than the respective energy gap wavelengths of said substrate, buffer layer, first window layer and second window layer, and said incident light enters from the end face of said first wave guide section which is opposite to the end face thereof adjacent to said second wave guide section and is wave-guided in said insulation film and said buffer layer.

3. A photodetector module comprising the semiconductor photo detector according to claim 2.

* * * * *